(12) United States Patent
Marsh et al.

(10) Patent No.: US 8,563,192 B2
(45) Date of Patent: Oct. 22, 2013

(54) GAS STORAGE SYSTEM

(75) Inventors: Stephen A. Marsh, Carlisle, MA (US);
Donald M. Parker, Marblehead, MA
(US); William J. Grande, Pittsford, NY
(US)

(73) Assignee: Encite LLC, Burlington, MA (US)

( * ) Notice: Subject to any disclaimer, the term of this patent is extended or adjusted under 35 U.S.C. 154(b) by 228 days.

(21) Appl. No.: 12/645,263

(22) Filed: Dec. 22, 2009

(65) Prior Publication Data

US 2010/0159343 A1 Jun. 24, 2010

Related U.S. Application Data

(60) Provisional application No. 61/140,349, filed on Dec. 23, 2008.

(51) Int. Cl.
*H01M 8/24* (2006.01)
*H01M 8/04* (2006.01)

(52) U.S. Cl.
USPC .................................. 429/444; 429/513

(58) Field of Classification Search
None
See application file for complete search history.

(56) References Cited

U.S. PATENT DOCUMENTS

| 2002/0069929 | A1 | 6/2002 | Shapovalov et al. | |
|---|---|---|---|---|
| 2003/0226356 | A1* | 12/2003 | Simburger et al. | 60/484 |
| 2004/0237346 | A1* | 12/2004 | Rudy | 36/29 |
| 2005/0139644 | A1* | 6/2005 | Brese et al. | 228/248.1 |
| 2005/0212111 | A1* | 9/2005 | Terazaki et al. | 257/686 |
| 2006/0280978 | A1 | 12/2006 | Takaku et al. | |
| 2007/0178335 | A1 | 8/2007 | Zimmermann | |
| 2007/0259236 | A1* | 11/2007 | Lang et al. | 429/30 |
| 2008/0035669 | A1 | 2/2008 | Curello et al. | |

FOREIGN PATENT DOCUMENTS

WO WO/2007144868 12/2007

OTHER PUBLICATIONS

EP Search Report, PCT/US2009//069473 Feb 27, 2013.
PCT International Search report Jul. 2011.
Translation of examination report China dated Jul. 31, 2103.

* cited by examiner

*Primary Examiner* — Ula C Ruddock
*Assistant Examiner* — Daniel Gatewood
(74) *Attorney, Agent, or Firm* — Fish & Richardson P.C.

(57) ABSTRACT

Among other things, a gas storage system includes a group of capsules and an activation element coupled to the group. The group of capsules are formed within a substrate and contain gas stored at a relatively high pressure compared to atmospheric pressure. The activation element is configured to deliver energy in an amount sufficient to cause at least one of the capsules to release stored gas.

35 Claims, 12 Drawing Sheets

GAS STORAGE SYSTEM

CROSS-REFERENCE TO RELATED APPLICATIONS

This application is a continuation application of and claims priority to U.S. Provisional Application No. 61/140,349, filed on Dec. 23, 2008, which is hereby incorporated by reference.

BACKGROUND

This disclosure relates to a gas storage system.

Fuel cells are devices that produce power by electrochemically reacting a fuel with an oxidizer. Fuel cell systems are of interest because they generally use more energetic fuels than traditional battery chemistries. Fuel cells combined with a fuel subsystem, may produce a battery replacement device that has more stored energy and in turn provides a significantly longer run time. It is desirable to make the volumetric and/or gravimetric energy densities of the entire battery replacement device significantly exceed that of the battery that it replaces. In general, this requires reducing or minimizing the size, weight and complexities of the fuel cell and fuel subsystem.

SUMMARY

In one aspect, the disclosure features a gas storage system that includes a group of capsules and an activation element coupled to the group. The group of capsules are formed within a substrate and contain gas stored at a relatively high pressure compared to atmospheric pressure. The activation element is configured to deliver energy in an amount sufficient to cause at least one of the capsules to release stored gas.

In another aspect, the disclosure features a method for constructing a system that stores gas. The method includes introducing an amount of liquefied gas into an assembly chamber, where a device having a plurality of micro-capsules that act as vessel to contain a gas under pressure and a lid substrate are placed. The amount of liquefied gas is selected to provide a predetermined pressure within the capsules after the liquefied gas transitions to a gaseous state. The method also includes bonding the lid substrate to the capsules to seal the gas inside the capsules.

In another aspect, the disclosure features a system for digitally controlled release of a fluid. The system includes a substrate. The substrate includes groups of fluid-filled capsules coupled to activation elements control circuitry configured to deliver a control signal to a selected activation element. The control signal causes the selected activation element to rupture a corresponding group of fluid-filled capsules to release fluid in the corresponding group to a device that accepts the fluid.

In another aspect, the disclosure features a fuel cell system for delivering power to one or more electronic devices. The fuel cell system includes a fuel cell element and fuel source. The fuel source includes a substrate that includes groups of gas-filled capsules coupled to activation elements and control circuitry configured to deliver a control signal to a selected activation element. The control signal causes the selected activation element to rupture a corresponding group of gas-filled capsules to send gas in the corresponding group to the fuel cell element.

In another aspect, the disclosure features a controller for controlling operation of a gas storage system. The controller includes logic circuitry to select a group of gas-filled capsules fabricated on a substrate. The circuitry includes circuitry to determine an address for the group, including an row count and a column count and circuitry to determine a substrate count that corresponds to the group of gas filled capsules.

The digital gas storage (DGS) system is for use with a variety of applications, one of which includes a fuel cell system. The DGS system stores gas at high pressure and releases the gas under digital control. The DGS system may be a stand-alone system or coupled with another system, e.g., a fuel cell, to which it supplies the gas. In some implementations, the DGS system is coupled with a fuel cell to provide a power generation system. Compared to conventional energy supplies, e.g., batteries, the power generation system including the fuel cell can have a power per weight an order of magnitude better than most battery chemistries. The DGS system includes an assembly of one or more DGS substrates having gas storage components that may be constructed within a silicon substrate on a micro scale.

The DGS system may be combined with a variety of fuel cells. Examples of which include small, lightweight, and high power density fuel cells, such as those described in application Ser. No. 10/985,736, filed Nov. 9 2004, now U.S. Pat. No. 7,029,779, and entitled "Fuel cell and power chip technology," the contents of which are incorporated herein by reference in their entirety.

A comparison of the DGS system's expected energy density, when combined with a fuel cell like that described in the referenced patent ("PT"), to that of conventional Li-Ion batteries, shows that the DGS system provides a significant improvement both volumetrically and gravimetrically. The details of the comparison are shown below in Table 1. Another advantageous feature of the DGS system is its ability to be implemented on a sub-millimeter scale, which enables fabrication of novel power systems and other devices.

TABLE 1

Energy storage density comparison.

| Parameter | Li-Ion | PT & DGS | Multiple |
|---|---|---|---|
| Volumetric, Wh/l | 350 | 843 | 2.4 |
| Gravimetric, Wh/kg | 150 | 1,648 | 10.9 |
| H2 storage, Wt % | | 8.63% | |

In addition to providing a substantial amount of stored energy on a micro level, the DGS device can also be used in other applications. For example, the DGS device may be used to store an antidote or fluids or solids. The DGS device can propel items such as a dart or used in connection with a reconnaissance device or used to deploy sensors. In another application, the DGS device may store different gases such as hydrogen or oxygen in different sections or capsules. The DGS device may provide buoyancy control to small underwater autonomous vehicles and alternatively may store vacuum.

The details of one or more embodiments of the invention are set forth in the accompanying drawings and the description below. Other features, objects, and advantages of the invention will be apparent from the description and drawings, and from the claims.

DETAILED DESCRIPTION

The DGS system stores a gas at a very high pressure in micro pressure vessels, herein called capsules, formed within a substrate of a high tensile-strength material. Units of the gas are selectively released from the micro pressure capsules using a digital control, such as that of a counter, state-machine, controller or processor. For example, in some implementations, the DGS system stores a high pressure hydrogen gas in the pressure capsules formed from single crystal silicon.

Hydrogen gas has a very high gravimetric energy density but does not compress well. Hydrogen gas is compressed to very high pressures to pack in enough hydrogen atoms to start to compete with other energy sources on a volumetric basis. Commercial hydrogen is stored in tanks at 2,200 pounds per square inch (psi). Even at this pressure, which is 150 times normal atmospheric pressure, it has less stored energy per unit volume or weight than a common battery. To achieve high energy densities, such as those shown in Table 1, the DGS system stores the hydrogen gas at approximately 17,500 psi, which is about 1,190 times normal atmospheric pressure. The material in which the hydrogen gas is stored has a high strength to contain the high pressure while minimizing the structural weight and volume thus achieving high volumetric and gravimetric energy densities.

To hold such a high amount of pressure, with additional consideration for safety, the DGS system uses crystalline silicon, e.g., single crystal silicon, having a theoretical tensile strength of over 1,000,000 psi. Tensile strength is a material property that defines the critical stress applied to the material to cause the material to fracture. In some embodiments, the DGS pressure capsules contain gases at a pressure of about 17,500 psi. The high pressure exerted on the inner surfaces of the capsules generates stresses that are within the ranges of the materials' tensile strength and leaves a sufficient margin for safety. For safety reasons, the parameters of the DGS system are selected so that the stresses within the silicon material do not exceed a predefined safety threshold. For example, a selection of parameters to provide a storage pressure of 17,500 psi include a micro capsule geometry with a diameter of approximately 50 µm and a minimum wall thickness of approximately 1.37 µm. Other parameter values are possible.

A high pressure, e.g., greater than one atmosphere and in particular, about 2,200 psi to about 17,500 psi, can be maintained in the micro pressure vessel capsules. In addition, if the safety margin relative to the tensile strength of the material is reduced, then pressures beyond 17,500 psi can also be used.

Figures 1A, 1B:
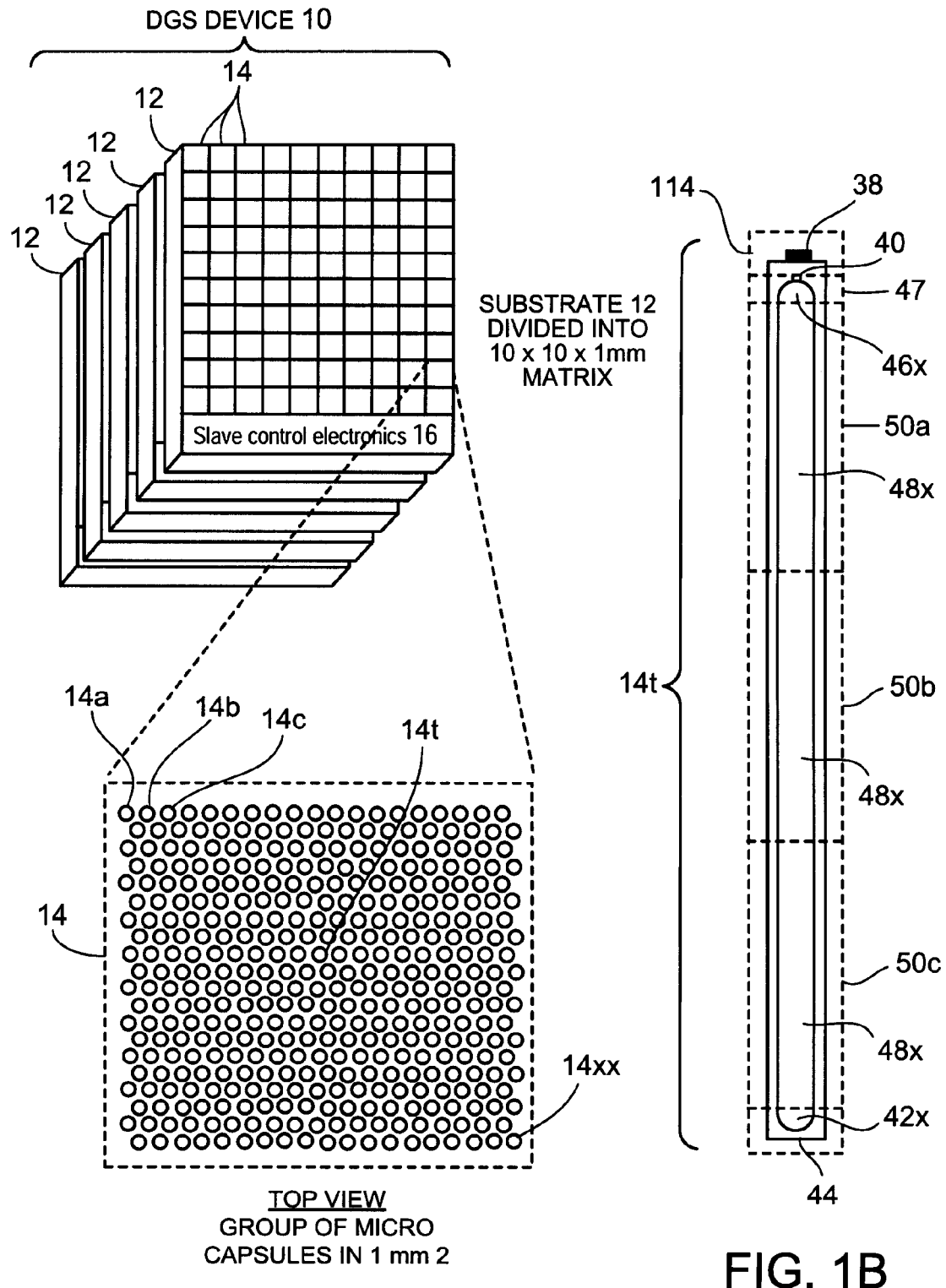
FIGS. 1A and 1B are perspective and cross-sectional views depicting in a hierarchical manner a digital gas storage (DGS) device.

Referring to FIG. 1A, a DGS device 10 includes at least one or more substrates 12 that are functionally divided into sections 14, each of which includes a group of gas-filled micro capsules 14a, 14b, . . . 14xx. The sections 14 are arranged in a grid format and the capsules 14a, . . . , 14xx are hexagonally arranged. Other arrangements can also be used. Each capsule 14a, . . . , 14xx is cylindrical (FIG. 1B) with hemispherical end-caps. The cylindrical section has a circular cross-section exposed in a surface of the substrate 12. Gas, e.g., the hydrogen gas, is stored in each capsules 14a, . . . , 14xx, and the gas is sealed in the capsules, via a silicon lid substrate 114 (FIG. 1B). Each section 14 (or each capsule) is activated to rupture and release gas via slave control electronics 16. The sections 14 are configured to release the gas stored in all of the capsules 14a, . . . , 14xx in a particular, selected section 14, without releasing the gases stored in capsules of the other sections 14.

As shown, each DGS substrate 12 has a slave control circuit 16 that is responsible for selecting which of its sections 14 is addressed for gas release. There is one master control circuit 20 (FIG. 2) for a DGS device 10 that controls the slave control circuits 16 for a corresponding number of DGS substrates 12. The master control circuit 20 may be on it's own control chip substrate. In some embodiments, the master control circuit 20 is on one of the DGS substrates 12. Other control configurations can be provided.

Two or more sections 14 can be activated simultaneously or at different times to release the gases stored in the sections 14. The dimensions and configurations of the substrate 12, the sections 14 (including individual capsules) and the capsules 14a, . . . , 14xx in each section 14 can be selected based on desired gas storage and release profiles. For example, the substrate 12 has dimensions of 1 $cm^2$ and a thickness of 1 mm. The 1 $cm^2$ area is divided into one hundred (100) 1 $mm^2$ sections 14. Each 1 $mm^2$ section 14 includes a group of 378 micro capsules 14a, . . . , 14xx packed hexagonally and filled with gas.

Referring to FIG. 1B, one capsule 14t in the section 14 can have a cylindrical body 48t formed in one or more layers of materials, e.g., three layers 50a, 50b, 50c. The two ends of the cylindrical body 48t are capped with a bottom cap 42t formed in one layer of material 44 and a top cap 46t formed in another layer of material 47. In addition, the top cap 42t includes a port 40 that once exposed to the external region of the capsule 14t, allows fluid communication, e.g., gas communication between the external region and the internal of the capsule. The port is sealed by a lid 114 formed, e.g., as a layer of material. A thermal activation element 38 is located on top of the lid above the port. Once activated, the heat generated by the activation element 38 ruptures the lid and expose the port 40 to the external region of the capsule. The structure and formation of the capsules are described further below.

Figure 2:
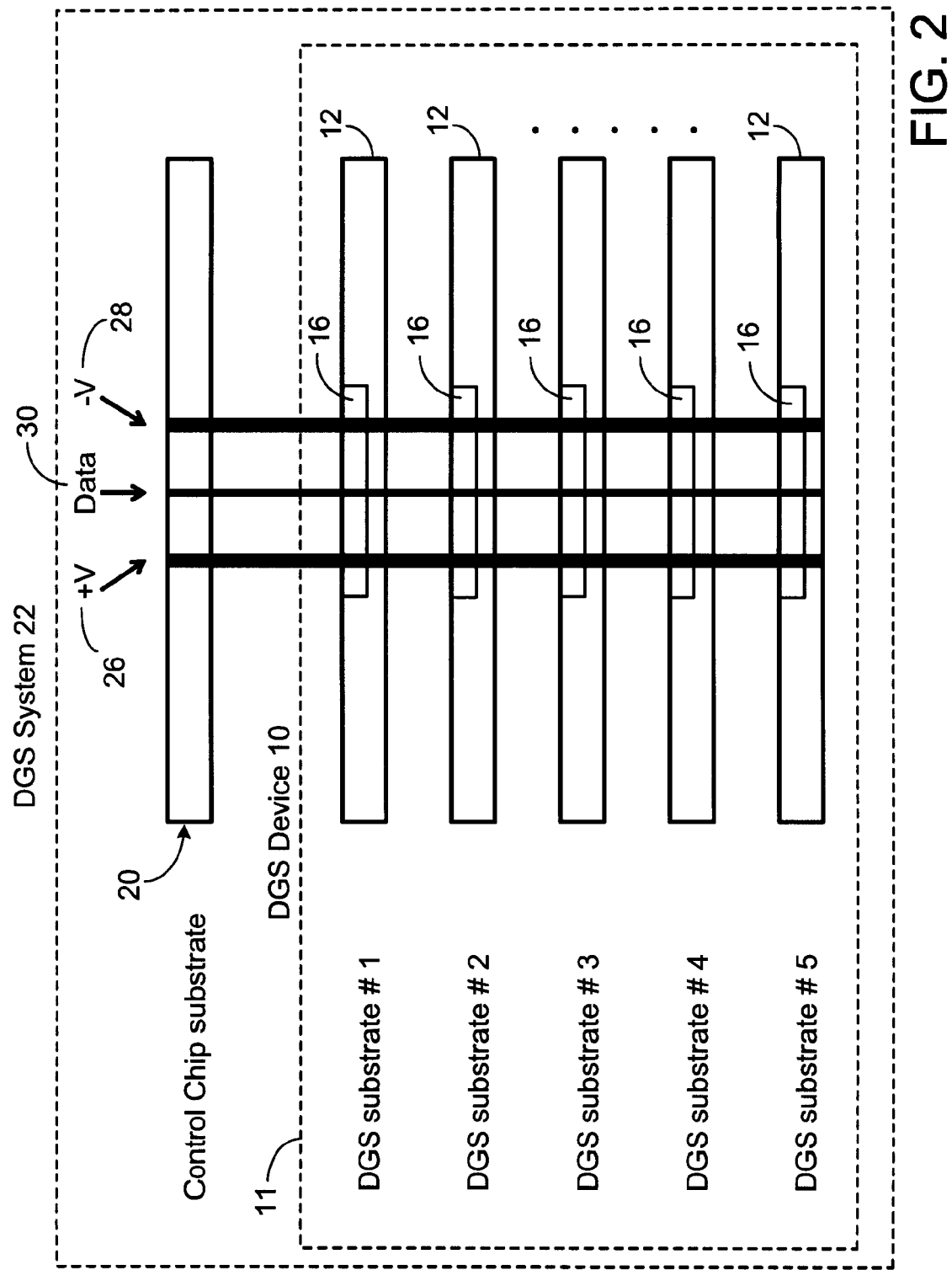
FIG. 2 is a diagrammatical view of a DGS system.

Referring to FIG. 2, a DGS device 10 includes a control chip substrate 20 (FIG. 9) and a DGS system 22 that has one or more DGS substrates 12 (see also, FIG. 1A) stacked with the control chip substrate 20. Master control circuits reside on the control chip 20. The master control circuits from control chip substrate 20 send control signals to the DGS system 22 to indicate which section(s) (e.g., section 14 of FIG. 1A) of which DGS substrate(s) 12 to activate. The control chip substrate 20 also monitors the pressure of the released gas from the DGS system. In particular, the control chip substrate 20 are electronically coupled to slave control electronics 16 on each substrate 12. The control chip substrate 20 can include a control circuit, for example, electrodes 26, 28, and data control 30, that delivers electronic signals, e.g., data signals, to desired slave control electronics 16 to activate sections of the substrate 12.

The DGS system 22 can have a variety of configurations. For example, the master control chip substrate 20 and the substrates 12 may be arranged in configurations other than those shown in FIG. 2. In some embodiments, the control chip substrate 20 and the DGS device 10 reside on separate devices that are electronically coupled to each other, e.g., via a wired or wireless connection. In some embodiments, the control chip substrate 20 and the DGS device 10 are integrated into the same device, e.g., as a completely stand-alone device. The slave control electronics 16 can reside on each substrate 12 or can reside on a separate member that is coupled to the substrate 12. The DGS system 22 may include its own power supply (not shown) or it may be coupled to an outside power supply (not shown).

Figure 3A:
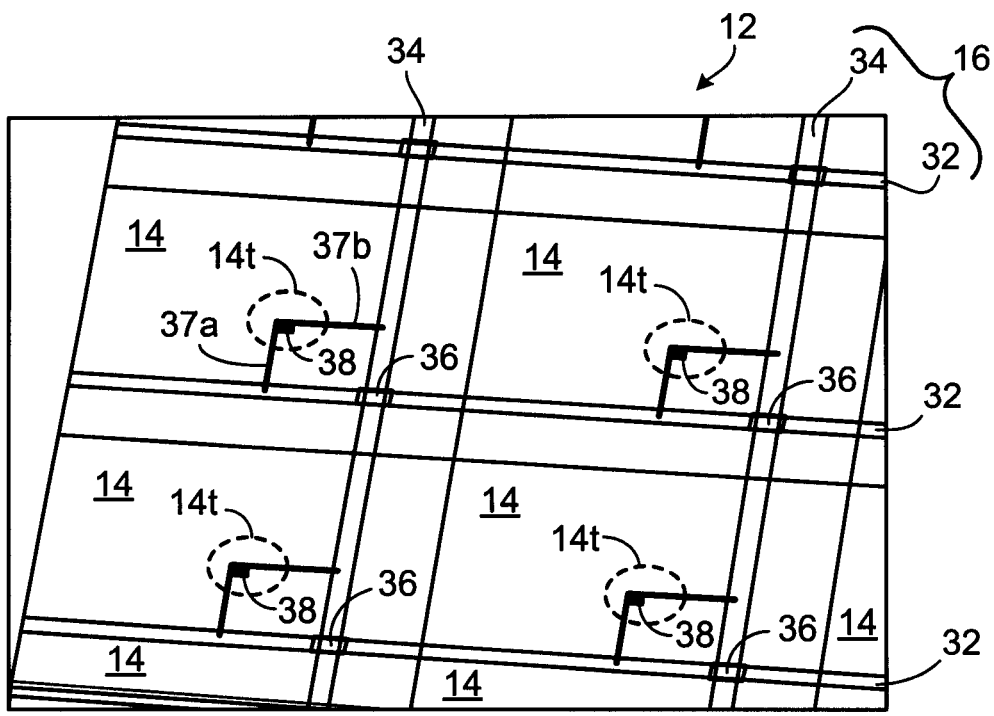
FIGS. 3A-3B are top views of the DGS substrate's row and column addressing.
Figure 3B:
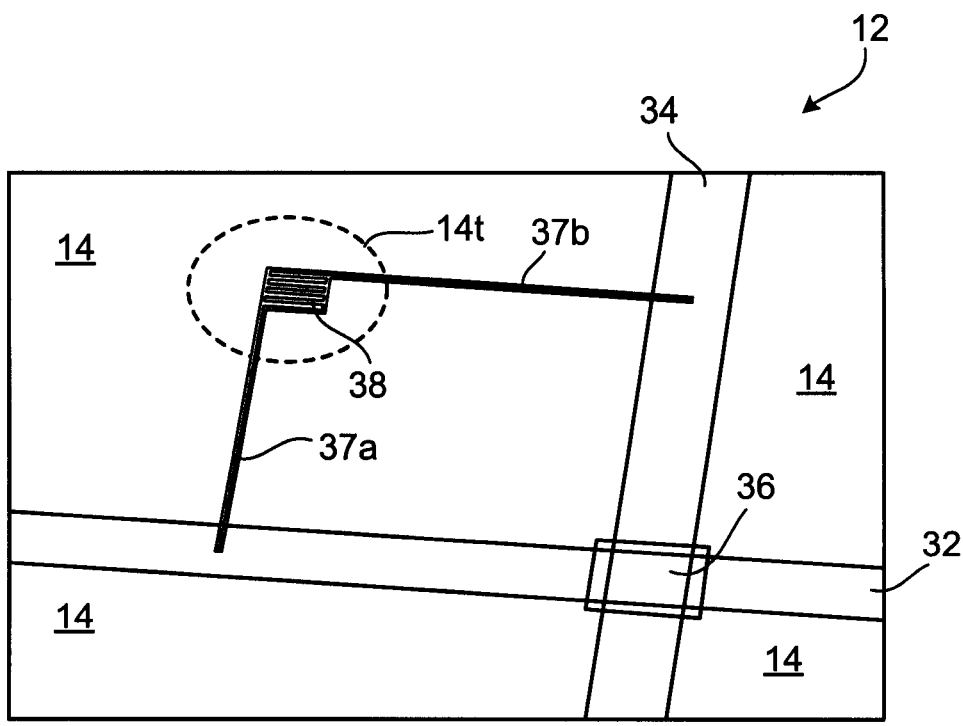

Referring to FIGS. 3A-3B, conductors of the slave control electronics 16 are arranged in the form of a standard row-column matrix (row conductor lines 32 and column conductor lines 34) and an activation element 38. This portion of the slave electronics has nodes 36 (i.e., an address line crossovers where a corresponding row conductor line is dielectrically isolated from a crossing column conductor line) located within the sections 14. From each of the nodes 36 a pair of conductors 37a, 37b couple their respective row 32 and column 34 conductors to a corresponding activation element 38. Current flow between a row line 32, a row conductor 37a, through an activation element 38 to a corresponding column conductor 37b and column conductor line 34 completes an electrical circuit (along with the remaining slave control electronics discussed below) and allows the activation element 38 to generate heat and rupture the lid substrate portion of the corresponding section 14.

The row-column matrix is disposed on top of the substrate 12, e.g., on top of the lid substrate that seals the capsules, or can be embedded in the substrate 12. Each section 14 is indexed (e.g., have an address within the substrate 12) based on the location of the corresponding activation element 38. Based on the addresses, the electronic signals (FIG. 9) delivered from the control chip substrate 20 (FIG. 2) are applied to the desired section 14 through the selected slave control circuit 16. In each section 14, at least one capsule 14t has its lid coupled to a thermal activation element 38 connected to the slave control electronics 16. When a particular section 14 on a particular substrate is selected by the master control chip substrate 20, the slave control electronics 16 on the particular substrate activates that section 14 based on the X row and Y column address. The slave control electronics 16 sends a current to the selected section 14, via the appropriate row and column conductors to heat the thermal activation element 38. When the thermal activation element 38 reaches a sufficiently high temperature, it activates the capsules in the selected section 14 by locally weakening and rupturing the silicon lids of one or more capsules in that section to release the sealed hydrogen gas from the ruptured capsules. The thermal activation element 38 may be composed of a variety of various conducting materials, for example, tungsten, other metals, or metal alloys. The activation element 38 may also include a chemical that releases heat and/or pressure by chemical reaction when electrically triggered by the control electronics 16. The activation element 38 may also include an electro-mechanical device to release the stored gas.

Figure 4:
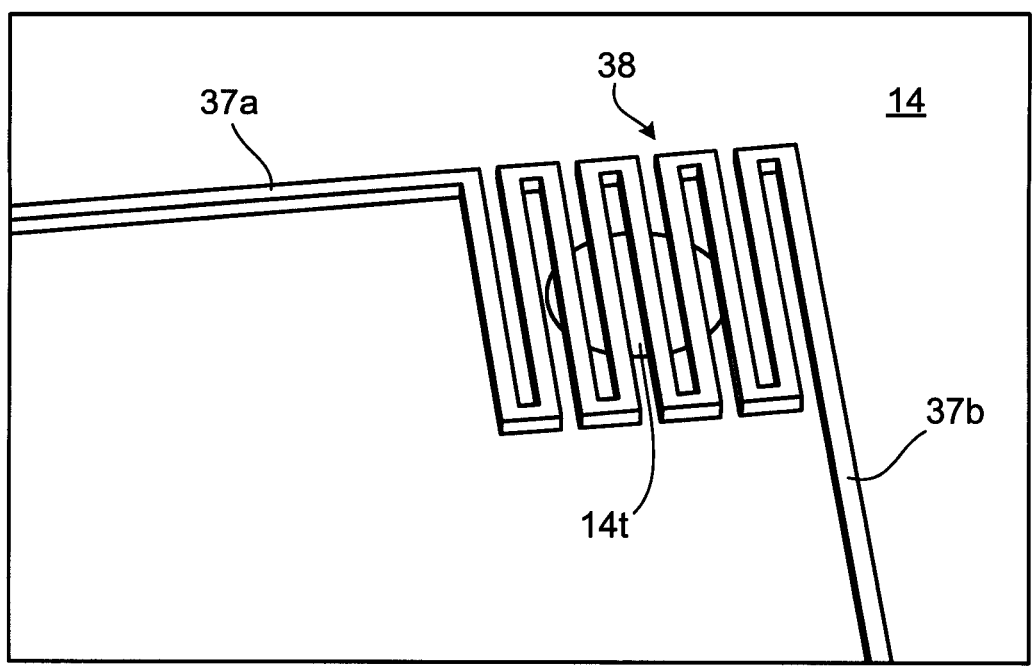
FIG. 4 is a blown-up top view of a portion of FIG. 3B showing a thermal activation element for use in the DGS system.

Referring to FIG. 4, one embodiment of the thermal activation element 38 has a serpentine shape to cover the cross-section of the capsule 14t and effectively transfer heat. The dimensions of the serpentine shape are selected based on the dimensions of the section 14 and capsule 14t. Other shapes for the element 38 can also be used.

Each capsule has a bottom cap, a top cap and a cylinder body, examples of which are depicted in FIGS. 1B, 5, 6, and 7A-B. Each component may be formed in a single crystal silicon wafer. Although the dimensions of the capsules can vary, one such possible set of approximate thickness dimensions is described below with respect to FIGS. 1B, 5, 6, and 7A-B.

Figure 5:
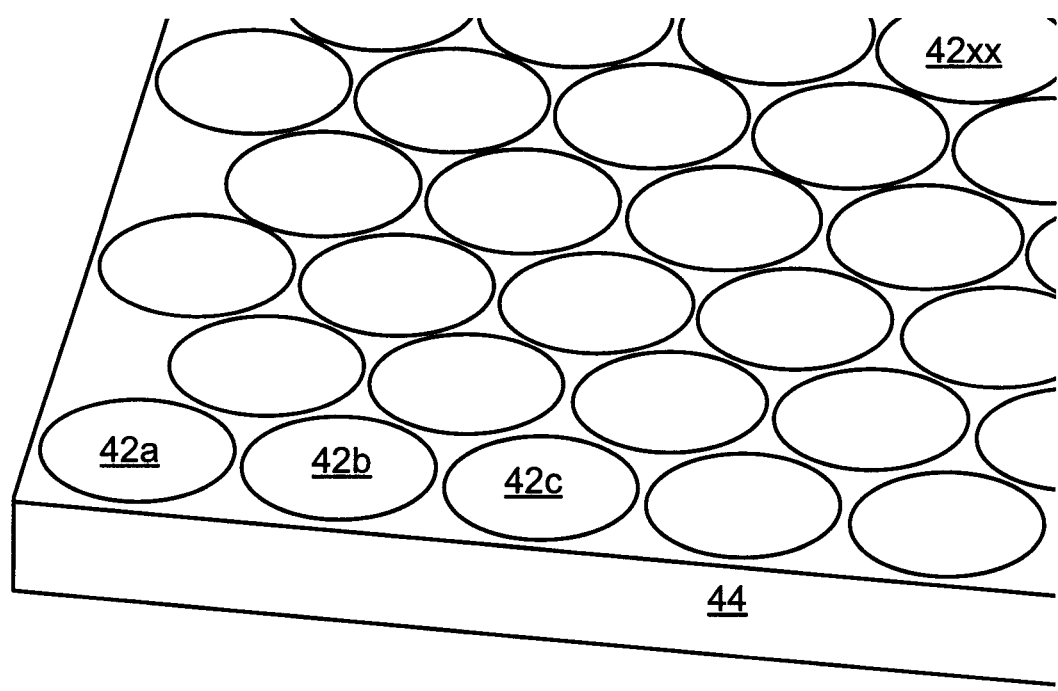
FIG. 5 is a perspective view of the bottom cap substrate of capsules in the DGS system.

Referring to FIG. 5, arrays of bottom caps 42a, 42b, 42c, . . . , 42xx, are formed in a single crystal silicon member 44. The silicon member 44 is about 30 μm thick, and each bottom cap 42a, . . . , 42xx is hemispherical having a uniform diameter, e.g., about 50 μm. The silicon member 44 can include 100 s to 1000s of caps. The arrays of bottom caps are isotropically etched into the silicon member 44 in a hexagonal packing. Other configurations, such as other polygonal configurations, circular configurations, and linear configurations, may be used.

Figure 6:
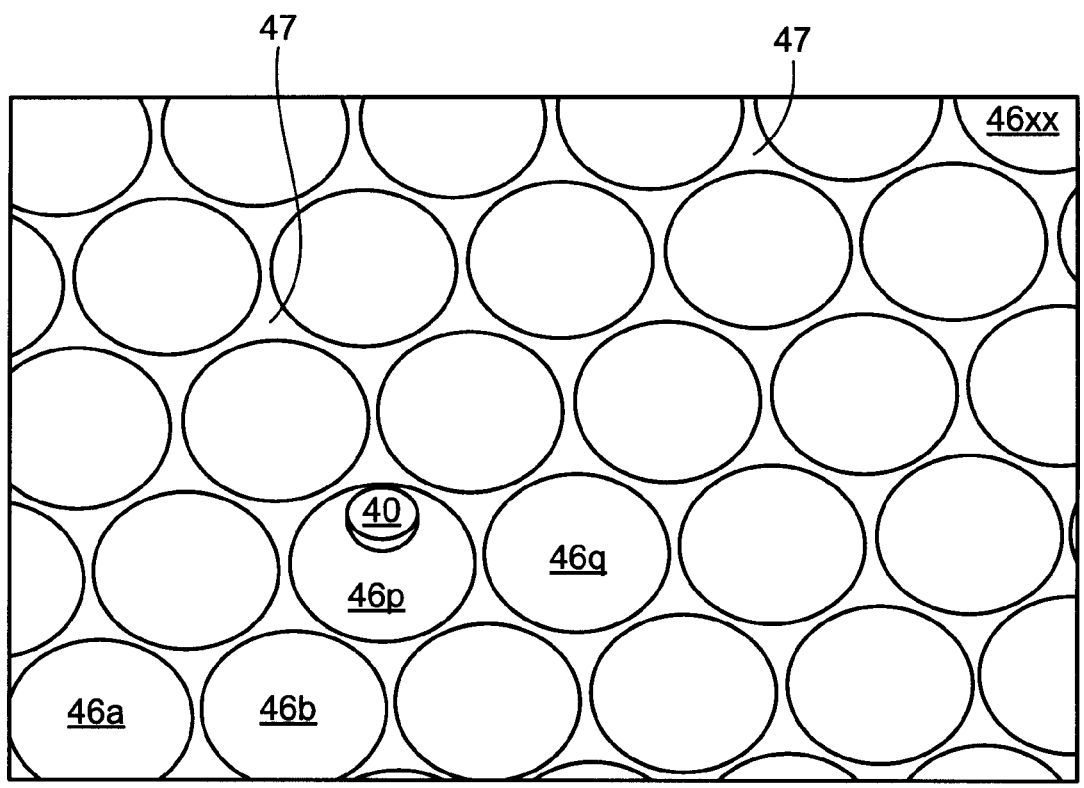
FIG. 6 is a view showing top caps substrate of the capsules from the inside looking upward.

Referring to FIG. 6, similar to the bottom caps of FIG. 5, arrays of top caps 46a, 46b, . . . , 46xx, are formed in a single crystal silicon member 47 having a thickness of about 30 μm. In addition, one of the top caps, 46p, has a gas fill/release port 40 that connects the interior of the capsule to the exterior of the capsule. The port 40 is circular and has a diameter, e.g., of about 20 μm. The port 40 can have other shapes. In some embodiments, the capsules within one section 14 (FIG. 1A) are interconnected by small open pathways (not shown) that allow gas to flow among the capsules. Only selected capsules, e.g., one capsule 46p, include the port 40 for filling and releasing gases into or out of all of the interconnected capsules. Multiple top caps can have ports like the port 40. In other embodiments in which a section of capsules are arranged in a cascade configuration (discussed below), each top cap of the capsules includes a port 40 (not all shown).

The port(s) 40 are sealed by sealing lid(s) formed in a single crystal silicon member (FIG. 1B) having a thickness of about 20 μm. As explained previously, part of the control electronics 16 (row and column line conductors) are fabricated on top of the lid substrate. The control electronics can also be formed on top of the lid substrate and are formed prior to the lid substrate being used to seal the capsules.

Figure 7A:
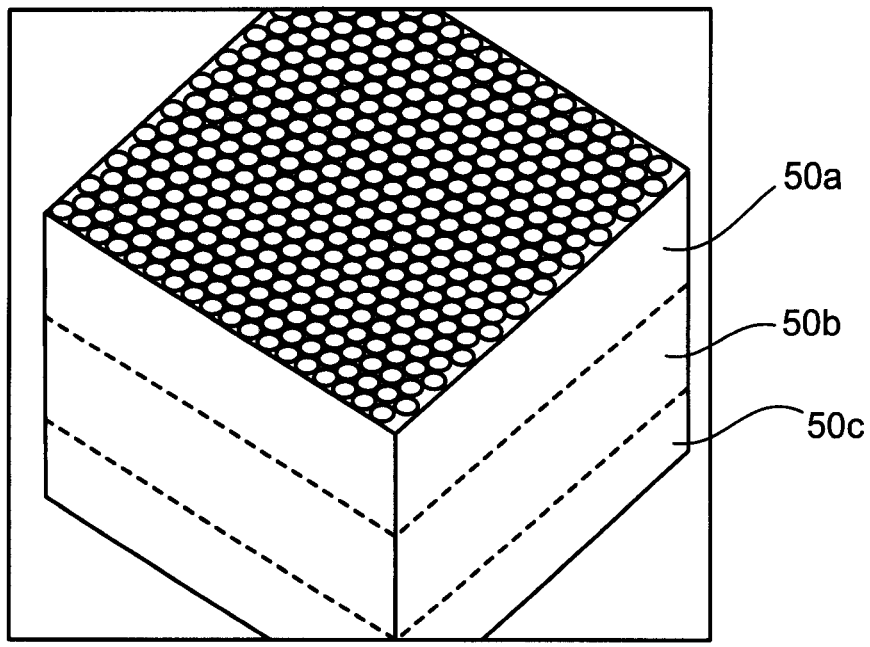
FIGS. 7A-7B are perspective views of the cylindrical shaped interiors of the capsules.
Figure 7B:
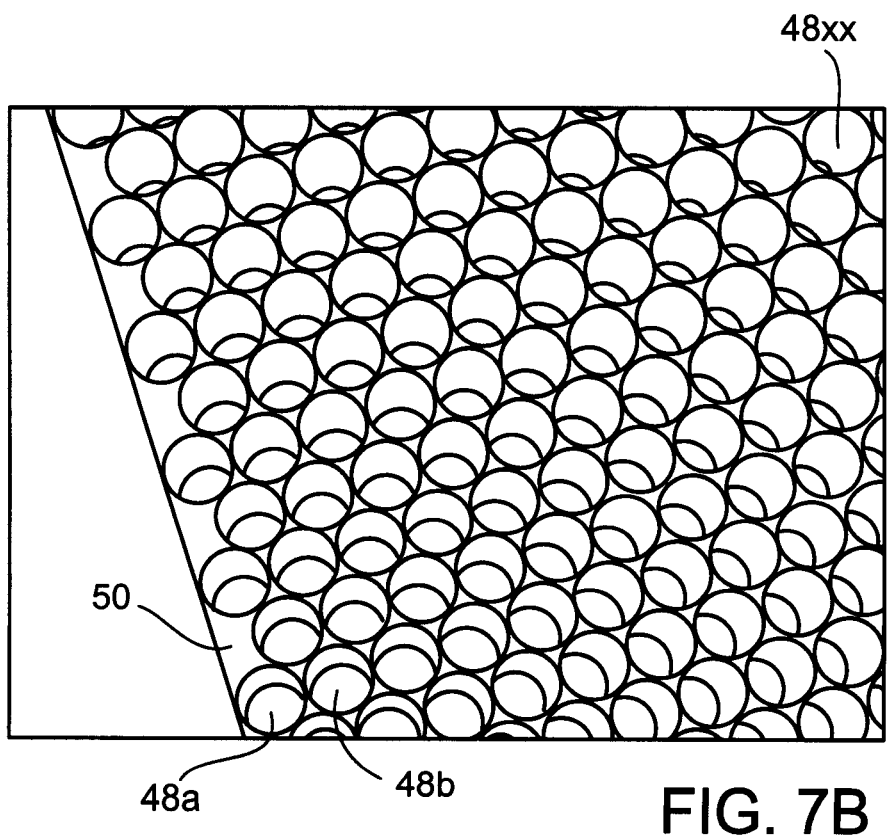

Referring to FIG. 7B, arrays of cylindrical bodies 48a, 48b, . . . , 48xx are formed in single crystal silicon member 50 having a thickness of about 900 μm (microns) to about 1000 μm (this is but an exemplary range, other ranges are possible). A specific thickness is 940 μm. In general, the thickness can vary depending on the DGS application. In some embodiments, each cylindrical body has a diameter of about 50 μm and each 1 mm×1 mm area of the silicon member 50 can include 378 cylindrical bodies packed hexagonally. Multiple layers of silicon member 50 are stacked to form elongated cylindrical bodies. In the example shown in FIG. 7A, three silicon members 50a, 50b, 50c, each having the feature of the silicon member 50 of FIG. 7B are stacked so that the cylindrical body 48a, . . . , 48xx has a tripled length (see also, FIG. 1B). Any numbers of silicon members 50 can be stacked.

The DSG substrate 12 of FIG. 1A can be formed by stacking the silicon member 44 carrying the bottom caps, the at least one silicon member 50 carrying the cylindrical bodies, the silicon member 47 carrying the top caps, and the silicon member 114 carrying the sealing lids. The capsules 14a, . . . , 14xx in each section 14 (FIG. 1A) can have various configurations. In one configuration, the capsules each have a small open pathway connected to the other capsules. The pathway can be located on the sidewall of each capsule and can be built during the fabrication of the capsules. The pathways provide gas fill/release ways to each capsule. For each section 14, only one release port (not shown) is needed to release the gas in all interconnected capsules in the section.

In some embodiments, the capsules 14a, . . . , 14xx are isolated from each other (e.g., no interconnecting pathways). Within a section, the sidewall of each capsule is designed thinner than the thickness required to contain the high pressure gas if the capsule were standing alone with ambient pressure surrounding it. If isolated, a single high pressure filled capsule surrounded by low ambient pressure would burst. However, when packed together, these capsules are able to hold the storage pressure without having their sidewalls bursting, because the reciprocal forces that the capsules exert on each other's sidewalls balance and compensate for the thinness in their walls.

In use, the overall strength of the section of capsules is sufficient to hold a storage pressure while the strength of an individual capsule is not. When the sealing lid of a particular capsule of the section is opened, the pressure within the particular capsule falls to around ambient. If the minimum wall thickness of the surrounding capsules (adjacent to the particular capsule) is insufficient to allow them to stand alone (17,500 psi inside, ambient outside), the walls between these surrounding capsules and the particular capsule break. The gases stored in the surrounding capsules is released from the opened lid. This process will repeat as a cascade failure until the perimeter capsules of the section are reached. The gases in the entire section 14 is released through one open lid. The walls between adjacent sections 14 are built to the thickness required to hold the pressure so that the cascade failure within one section 14 does not spread into other sections and gas release in each section 14 can be independently controlled and operated without affecting other sections 14.

As described above, the mechanism for releasing the gas from a section 14 of micro capsules 14a, . . . , 14xx is heating the lid of at least one capsule. The tensile strength of a material is affected by temperature, i.e., it gets weaker as the temperature goes up. Only within a certain range of temperatures does the single crystal silicon used for the lids of the capsules have a sufficiently high material strength to withstand the high gas storage pressure within the capsules. When exposed to temperatures above this range, the tensile strength of the silicon lids decreases to the point where the lids rupture and release the gas that they contain. The temperature that causes tensile strength of single crystal silicon to drop below the level required to maintain the storage pressure is referred to as the "rupture temperature." The rupture temperature depends on the geometry of the capsule's top cap and the sealing lid. For a DGS device including capsules having the dimensions shown in FIG. 1A, the rupture temperature may be approximately 150° C. At this temperature, the sealing lid ruptures, and the gas escapes.

The energy used by the thermal activation element 38 (FIG. 4) to heat the silicon lids to the point of rupture is called the "activation energy" and is a parasitic loss of system energy. The loss of the system energy is dependent on the configuration of the capsules and can be reduced by heating one capsule and causing call capsules in a section 14 to release the stored gases. The activation energy may be expressed as the percentage of the total stored energy within the section. In some studies, the activation energy of the DGS device described in FIG. 1A was calculated to be less than 1%.

Hydrogen molecules are the smallest molecules and are known to permeate through all materials given enough time. The rage of permeation can be determined, for example, based on the storage material's characteristics, temperature and pressure on the hydrogen gas. In some embodiments, at a storage temperature of 500° C., which is higher than the temperature of expected use and storage for the DGS device 10, we believe that it could lose about 1% of the total stored hydrogen after about 73 years.

Single crystal silicon is used to construct the pressure capsules and their lids due to its high tensile strength, a bulk property, of over 1,000,000 psi. Without being bound by theory, is believed that the crystalline lattice structure of the single crystal silicon provides the high tensile strength. Pieces of silicon materials can be bonded, e.g., via fusion bonding, in such a way as to produce "effectively" a single piece. The bulk properties of the single crystal silicon, in addition to the capsule geometries, allow the capsules to contain gas at a pressure of 17,500 psi. Other materials, such as diamond, could also be used to construct the capsules, including any of its components depending on the gas and the pressure to be contained within the capsules.

The single crystal silicon sealing lid that covers the fill/release port of a capsule is bonded to the capsule by anodic bonding (further described below). This process produces a transition layer of sodium-doped silicon dioxide ($SiO_2$) between the capsule and the lid. The sodium-doped silicon dioxide can have bulk properties with respect to tensile strength different from the crystal silicon. The sodium-doped silicon dioxide is a thin, e.g., on the order of, sub-micron layer, such as an interfacial layer in thickness of joint material. The sodium-doped silicon dioxide is covalently bonded to both the crystal silicon of the capsule body and the lid and completely fills surface roughness or voids between the capsule and the lid. The transition layer can withstand the pressure within the capsule that pushes silicon lid outward and cannot be extruded out from between the lid and the capsule body by the high pressure of the contained gas because of the very large length-to-height ratio of the layer (greater than 50 to 1). The transition layer also has a low permeability to hydrogen molecules.

The slave control electronics 16 are applied onto the lids prior to bonding the lids to the capsules to seal the gases and can include a semiconductor circuitry, e.g., CMOS circuitry and metallization. The materials used allows these circuits to tolerate high temperatures, e.g., about 400° C. used in the anodic bonding process.

Processes for fabricating the DGS substrate 12 are now described in detail. As an overview, DGS capsule subcomponents (FIG. 11), the body 50a, 50b, 50c, the top caps 47, and the bottom caps 44, are made from different single crystal silicon substrates or wafers that are separately processed. These capsule subcomponents are assembled to form a single "capsule subassembly" 55. In some embodiments, the body of the capsule can be formed in more than one silicon substrate, which can be pre-assembled using, e.g., fusion bonding. The bottom caps are fusion bonded to one end of the cylinder body of the capsule, and the top caps are fusion bonded to the other end. In some embodiments, the bottom and top cap pieces are attached to the silicon substrate containing the cylindrical capsule bodies at different times during assembly. The capsule components, including their subcomponents, may be assembled in other orders Separately, a lid substrate 114 is constructed with activation elements 38, X and Y addressing 32, 34 and electronic slave control circuits 16. Subsequently in an high pressure assembly chamber, the capsules within the capsule subassembly are filled with a high pressure gas and sealed with the lid substrate 114.

DRIE (deep reactive ion etching) is one of several processes that may be used to fabricate the cylinder body or sidewalls of the capsules, as well as, the gas fill/release ports/pathways. DRIE is a dry etch process and is suitable for forming features having an aspect ratio of up to about 20:1 (e.g., the ratio of the depth and the width of the capsule on the DGS device). Alternatively, the cylinders can be fabricated through electrochemical etching of a silicon substrate. The cylinders are fabricated by selectively etching cylindrical regions of a crystal silicon substrate, as part of an electrochemical cell, to form porous silicon regions in these cylindrical regions. After the porous silicon is formed in the cylindrical regions, the porous silicon may be converted to silicon dioxide by exposing the porous silicon to oxygen at elevated temperature, and the silicon dioxide can be removed with an Hydrofluoric acid (HF) dip while the crystal silicon in other regions of the silicon member remain substantially intact.

The fabrication processes may induce surface roughness on the walls of the formed capsules, which could adversely affect the tensile strength of the material. It is desirable to take this factor into consideration when determining wall thickness between adjacent capsules and between adjacent sections 14.

Alternatively, laser ablation can be used remove silicon material and to form the sidewalls of the capsules. High energy laser pulses, e.g., femto laser pulses or picosecond laser pulses, are applied to selected locations of a silicon member to form capsules at those locations. The dimensions and shapes of the capsules are controlled by controlling parameters associated with the ablation, e.g., laser energy and duration of the process. Sidewalls of the capsules can be formed quickly and precisely without substantially changing the crystalline properties of the remaining silicon material.

The hemispherical bottom and top caps of the capsules are fabricated using wet etching. The fabrication scheme may optionally include forming pores at selected locations of a crystal silicon member. The porous silicon at the selected locations, if implemented, acts as a gas flow throttle. The silicon substrates containing the top and bottom caps can be attached to the silicon substrate containing the cylindrical bodies of the capsules by, for example, fusion bonding (also known as silicon welding) to fully form the capsule subassembly 55 whose capsules are empty and unsealed. Generally, fusion bonding occurs in a chamber at a high temperature, e.g., about 1,000° C. and in a low pressure, suitable gas environment. The surfaces of the silicon substrates can be treated to be smooth and clean to facilitate formation of the bonding between them.

The fused silicon substrates containing the fully formed capsules ("capsule subassembly") to be gas filled and sealed, are placed in a high pressure assembly chamber that will contain a hydrogen gas at about 17,500 psi, as discussed below. The chamber is designed and built to withstand high pressures and is capable of holding a pressure up to, e.g., about 50,000 psi. The chamber heats the silicon capsule subassembly and the separate lid silicon substrate to about 300° C. to about 500° C., e.g., about 400° C. Then the two silicon pieces to be anodically bonded are arranged so that one piece has a voltage of about 1,000 volts relative to the other piece. The high temperature and high voltage bonds the silicon pieces together to form sealed capsules that store the high pressure hydrogen gas.

Figure 8:
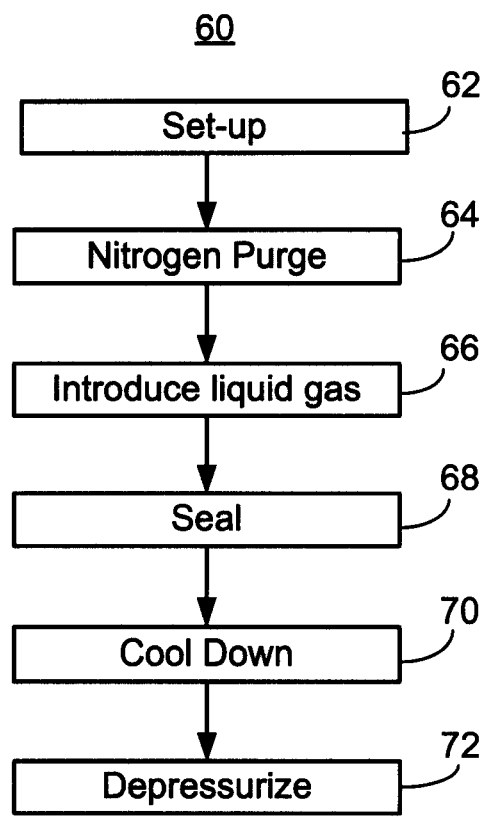
FIG. 8 is a flowchart.

Referring to FIG. 8, capsules in which the hydrogen gas is stored are gas filled and sealed in a high pressure assembly chamber using a process 60. The assembly chamber is initially set up and in condition for use. A mechanical arrangement is provided for putting the lid substrate into position on the capsule subassembly once the assembly chamber is at a desired pressure (e.g., 17,500 psi). The assembly chamber is equipped with electrical connections to provide the voltages used during the anodic bonding procedure and a heater element for heating the two silicon substrates.

In the set-up process 62, the silicon capsule subassembly and the sealing lid substrate are placed properly in the assembly chamber and the assembly chamber is sealed. A nitrogen purge (64) process is performed within the assembly chamber that removes oxygen from the assembly chamber by purging the assembly chamber with an inert gas, such as nitrogen. Trapped air in the assembly chamber is displaced with the inert gas that does not substantially interfere with the processes to be performed in the assembly chamber. In some embodiments, the nitrogen purge process (64) is a pump-purge process including alternating steps of pumping the chamber down to mild vacuum (e.g., 1 millitorr) and back-filling with pure nitrogen. It is desirable to have substantially no oxygen in the assembly chamber during the high voltage anodic bonding process, e.g., for safety of the process. Removing air can also facilitate minimizing potential contamination of the hydrogen as the hydrogen gas is being sealed into the pressure capsules. After the assembly chamber has been thoroughly purged (e.g., of oxygen), the nitrogen is evacuated e.g., until the assembly chamber is in a light vacuum. This evacuation procedure is performed so as not to dilute with nitrogen the gas that will fill the chamber next. It also prevents nitrogen from being trapped and compressed in the capsules.

A liquefied gas, e.g., a quantity of cryogenically condensed hydrogen gas, e.g., that is pressurized and cooled to a very low temperature to exist in the liquid phase is introduced (66) into the assembly chamber. The liquid flashes to a gas as it warms thus pressurizing the assembly chamber. The amount of liquefied gas introduced into the chamber is selected such that the final gas pressure within the high pressure assembly chamber reaches a predetermined pressure, e.g., of 17,500 psi at ambient temperature. The amount of liquefied gas needed to be introduced is calculated based on the total volume of the interior of the assembly chamber, the thermodynamic state of the cryogenic liquid and the final state at equilibrium temperature (ambient). The final gas pressure is controlled by adjusting the amount of liquefied gas introduced into the assembly chamber and by controlled venting of high pressure gas, if needed. Filling the assembly chamber with the gas to the desired pressure in the manner described above provides a relatively simple and effective process to introduce hydrogen into the capsules in a efficient manner. In other embodiments, compression equipment e.g. multistage compressors and hydraulic ram systems can pressurize gas to the desired pressure.

The hydrogen gas enters the capsules due to the high pressure within the assembly chamber. The capsules are then sealed by the lid substrate using an anodic bonding process within the assembly chamber. Again, without being bound by theory, it is believed that covalent bonds are formed between the silicon atoms in the lid silicon substrate and the top caps of the capsules and the silicon oxide formed by the anodic bonding process.

The sealing process (68) begins with pressing the aligned capsule subassembly 55 (FIG. 11) and lid substrate 114 together. Both silicon members are heated to approximately 400° C. A 1000 V voltage is applied across the two silicon members. The voltage accelerates the bonding process between the two silicon members and fills possible voids between surfaces of the members (e.g., due to surface roughness). A strong and gas tight seal can be formed. The press force is then released.

The sealed capsules containing the hydrogen gas are cooled down (70). The temperature in the assembly chamber is reduced to ambient. The assembly chamber is depressurized (72). The residual hydrogen gas in the assembly chamber can be re-circulated back into a cryogenic system or safely vented.

After the process 60 has been completed, the substrates carrying the capsules are diced into a predetermined size according to the needs of a specific application and integrated into the DGS device 10 of FIG. 2. In use, the DGS device 10 of FIG. 2 is placed within an enclosure 11 (FIG. 2) that serves as a gas chamber. The gas chamber collects gas released by the DGS device and also prevents gases outside the gas chamber from entering the DGS device. The gas released from the DGS device into the gas chamber is supplied to a device, e.g., a fuel cell, coupled to the gas chamber. The control chip substrate 20 of FIG. 2 monitors the pressure in the gas chamber in order to know when to instruct the DGS device to release more gas. In some embodiments, the control chip substrate 20 of FIG. 2 can be included within the chamber 11 and in others it is external to the chamber 11, as shown in FIG. 2. In some embodiments to facilitate gas flow from the DGS device 10 when sections 14 are ruptured the substrates 12 can have one or a plurality of grooves, e.g., V-shaped grooves or other similar types of channels (in various configurations not shown) fabricated on the back sides of the substrates.

The gas released initially from the DGS device 10 expands to the volume of the gas chamber, which has an ambient pressure and temperature. Given the fixed volume of the gas chamber, the gas released later from the DGS device 10 can increase the pressure within the gas chamber. In some embodiments, the gas chamber includes an accumulator to prevent the pressure from rising above a predetermined value (e.g., 1 psi). The accumulator has a collapsed state in which the volume is small, and an expanded state to accommodate an increased pressure. In use, the accumulator expands to accommodate the volume of the recently released gas to prevent the pressure of the gas chamber from rising significantly. The volume of the accumulator is affected by the amount of gas released from the DGS device and the shape is variable based on specific applications. The accumulator may be integrated into the gas chamber.

Referring back to FIG. 2, a three-wire communication interface scheme is built between each DGS substrate 12, e.g., the slave control electronics 16 and the master control chip substrate 20. The substrates 12, 20 may be electrically connected in serial or parallel. Two types of signals are used by the interface, corresponding to power and information, respectively. The power signals include a −V signal, e.g., sent from the electrode or conductor 28 on the control substrate 20. The −V signal can serve as a reference signal to the information signal and also as a sink to the current source. The power signals also include a +V signal via the electrode or conductor 26 that sources the current to the selected thermal activation element 38 of FIG. 3A.

Figure 9:
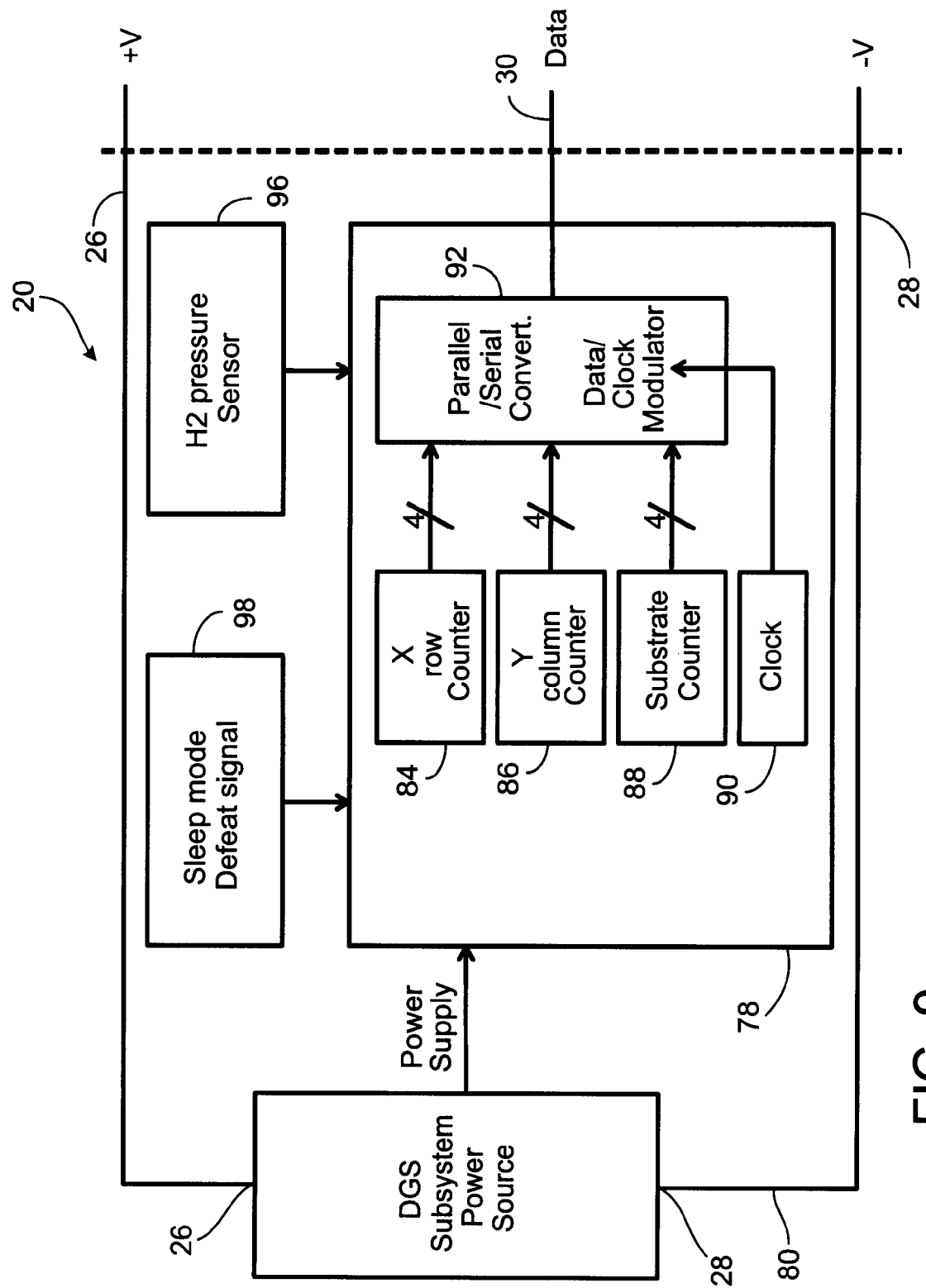
FIG. 9 is a block diagram of a master control circuit.

Referring to FIG. 9, the control substrate 20 includes circuits 78 that monitor and manage gas release from the DGS device 10. A power circuit 80 can be included on the control substrate 20 to provide power to the circuits 78 and deliver power via electrodes or conductors 26, 28 to control the slave circuits 16 on each of the DGS substrates 12. Other arrangements to provide power to the control circuits 78 and 16 are possible and include voltage regulation of the power circuits. The circuits 78 include an X row counter 84, a Y column counter 86, and a substrate counter 88. The circuits 78 use the substrate counter 88 to select a particular substrate 12, and use the X row and Y column counters 84, 86 to select a particular section 14 on the particular substrate 12. Any section 14 in the DGS device can be located using the three counters 84, 86, 88.

The circuits 78 also include a clock circuit 90. Clock information is modulated with X, Y addressing data and substrate and sent to the control electronics 16. The modulated clock and data information are transmitted from a parallel to serial converter circuit 92, in which parallel data and clock information corresponding to an X row count and a Y column count and substrate is converted into a serial stream of data and embedded clock information. Based on the address of a selection by the counters 84, 86, 88, the data and clock information is delivered from the circuit 92 through a data line 30 (see also, FIG. 2) to the decode circuits and then to the selected section 14 to release the gas stored in the section 14.

The control substrate 20 can also include a pressure sensor circuit 96 that has a predetermined pressure threshold and outputs signal to indicate a low pressure when sensed pressure is lower than the pressure threshold. The pressure sensor circuit 96 can be used to initiate gas release from one or more particular sections 14 to maintain the pressure in the gas chamber in which the control chip substrate 20 is located.

In addition, the control substrate 20 includes a sleep mode circuit 98. When consumption of the released gas decreases or stops, the sleep mode circuit 98 interacts with the circuits 78 to make the DGS system 22 to enter the sleep mode (described below). It is desirable to prevent a high gas pressure from being applied to the control substrate 20 when the high pressure is not needed, so that no excessive amount of gas is supplied to the external gas consuming device. For example, the hydrogen molecules tend to permeate membranes used in a fuel cell that consumes the hydrogen gas, and excessive hydrogen gas provides a high pressure that may accelerate the permeation.

The information signals carry clock and data information. The clock information and the data information are modulated together so that only one wire is used (referenced to the −V signal). The data information includes a substrate count, an X row count and a Y column count, and are stored and managed on the control chip substrate 20. Other schemes can be used to allow the use of a single pulse (clock) that advances the local counters on each substrate. Each local counter can be enabled by a carry in/out signal daisy chained between DGS substrates. Other schemes for communication among the control chip substrate 20 and the DGS substrate 12 can be used.

A pressure sensor in the gas chamber, in which the DGS device 10 is placed, automatically monitors the gas pressure of the gas chamber and delivers information about demand for gas to the control chip. The pressure in the gas chamber is used to determine when to release the next quantity of gas. The process of gas release can continue uninterrupted until the DGS device 10 is out of gas. In some embodiments, the gas release can be suspended if the external gas consuming device stops, suspends, or substantially decreases consumption of the released gas and the DGS system 22 goes into a sleep mode. In the sleep mode, the amount of gas that is being used is substantially less than the normal operational state. In the sleep mode, the gas is released at a lower pressure so there is less leakage through the control chip, and/or it is released at greater intervals because there is less consumption. In some embodiments, the substrates 12 include special sleep mode capsules that store smaller amounts of gas to produce less pressure in the gas chamber when these sleep mode capsules release gas.

Figure 10:
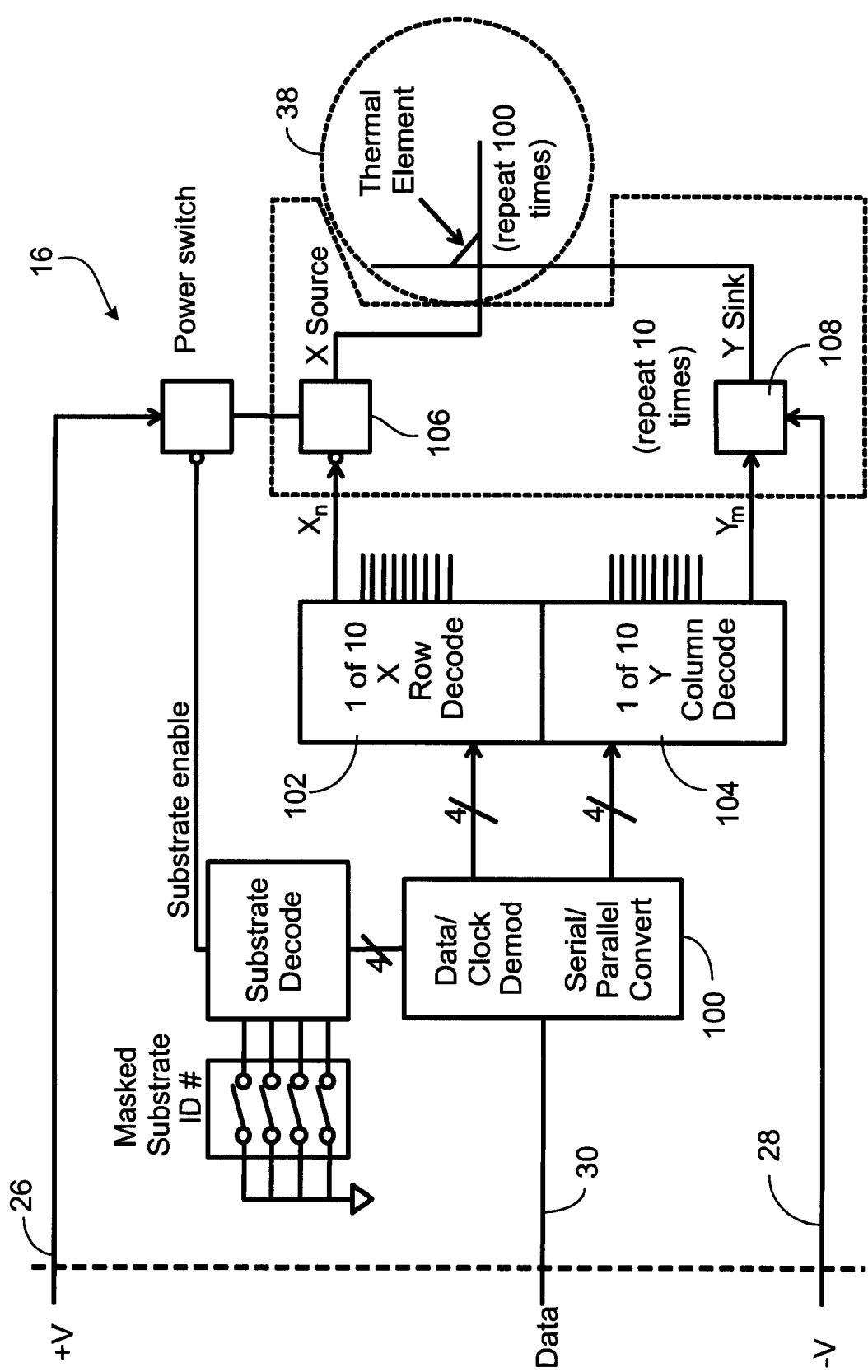
FIG. 10 is a block diagram of a slave control circuit.

Referring to FIG. 10, the DGS slave control electronics 16 on each DGS substrate 12 (FIG. 1A) decodes the data and clock information sent by the control circuits 78 of FIG. 9. The serial data and clock information is received at a serial/ parallel convert circuit 100, which demodulates the information to recover the data and converts the serial data back into a parallel format.

In an example in which the selected substrate 12 includes 100 (10×10) sections 14, the X row and Y column data is decoded to a one of ten select lines each using an X row decoder 102 and a Y column decoder 104. The selected row $X_n$ is connected to a current source 106 and the selected column $Y_m$ is connected to a sink driver circuit 108, respectively. The current source 106 and the sink driver circuit 108 deliver current to a thermal activation element 38 that has an addressed of $(X_n, Y_m)$ within the matrix of thermal activation elements on each substrate 12. Additionally, data related to the selection of the substrate 12 is also decoded, which is compared to a local substrate ID number. When a substrate 12 having a particular ID number is selected, a substrate enable signal turns on a power switch (not shown) to supply a current to the $X_n$. When no substrate is selected, no current flow is delivered to heat the selected thermal element at the address $(X_n, Y_m)$ Referring to FIG. 11, a cross-sectional view of a portion of the DGS substrate 12 includes sections 14 of capsules 14a, 14b, . . . , arranged in a cascade configuration. Each capsule 14a, 14b, . . . , is separated from other capsules by rupturable walls 112. As indicated by the solid horizontal lines, the DGS substrate 12 is formed from multiple silicon members 44, 50a, 50b, 50c, 47 and lid 114 stacked upon one another and bonded to each other. The sections 14 of capsules are each separated by thick walls 110 that are structured to limit the cascade rupture to an activated section 14 of capsules, thus preventing the non-activated adjacent sections from rupturing.

Figure 11:
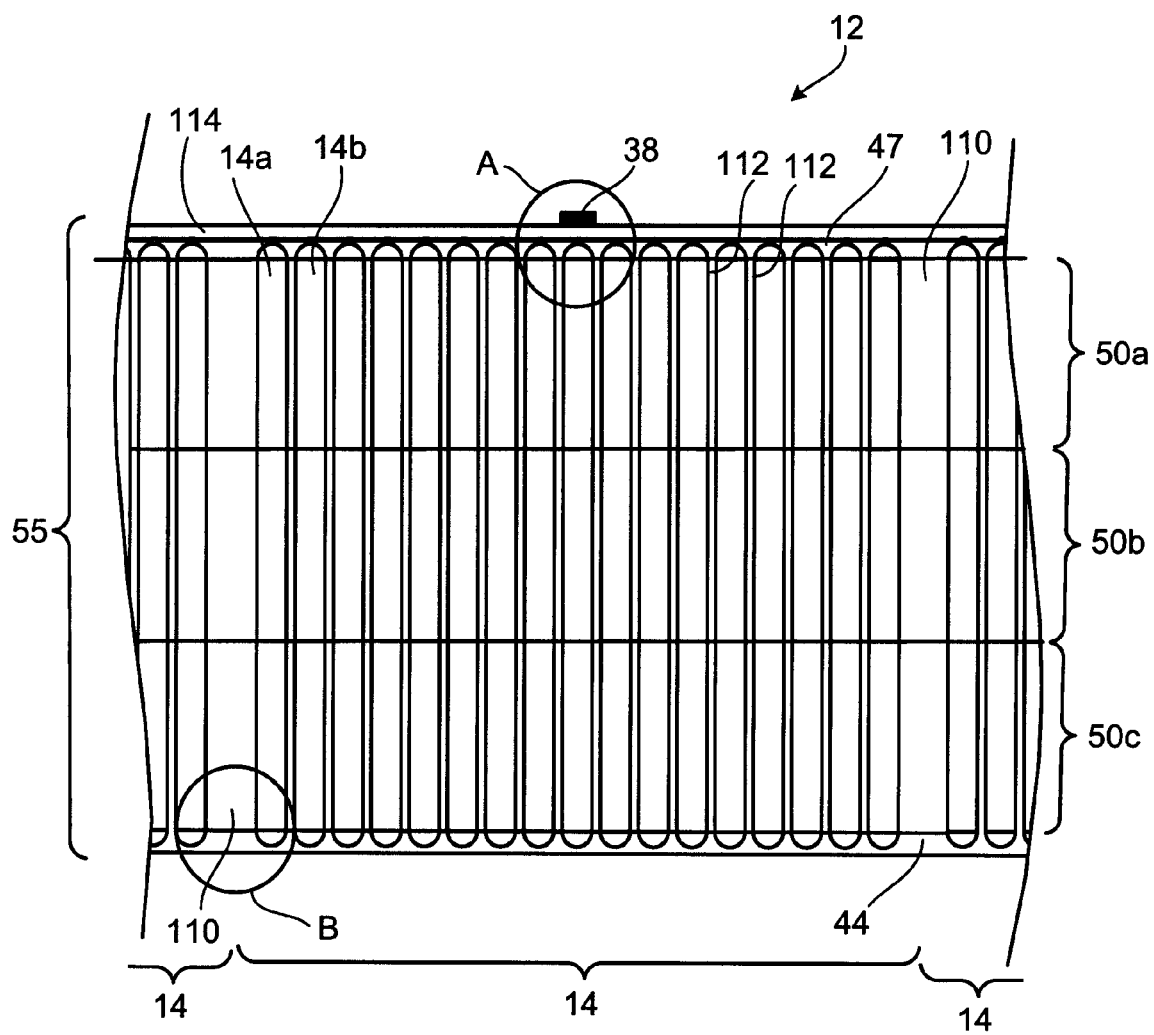
FIG. 11 is a schematic cross-sectional view of a cascade configuration of capsules.
Figure 12A:
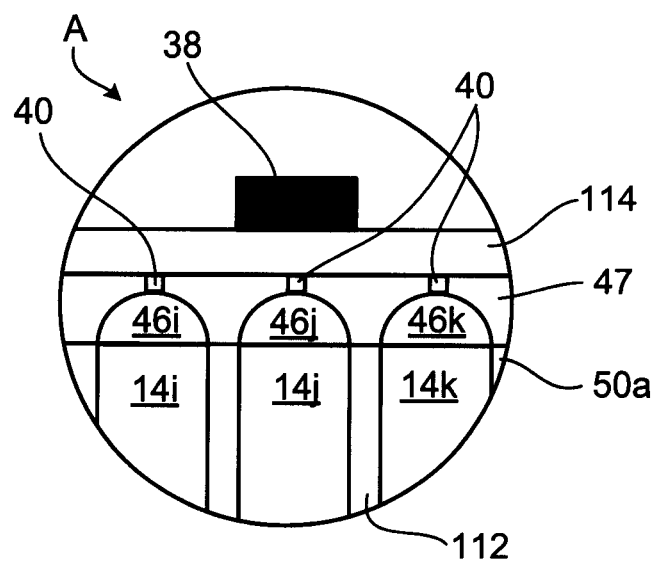
FIGS. 12A-12B are enlarged views of portions of the configuration shown in FIG. 11.

Referring now to FIG. 12A, a top area of the capsules of FIG. 11 in the circled area A is shown in detail. The top caps 46i, 46j, 46k of the capsules 14i, 14j, 14k include gas fill ports 40 covered by a thin lid 114. A thermal activation element 38 is in contact with the thin lid 114 and can be located above the center of one or more ports 40. The rupturable walls 112 each can be relatively thin and can have a thickness of about 0.8 micron to about 1.2 microns.

Figure 12B:
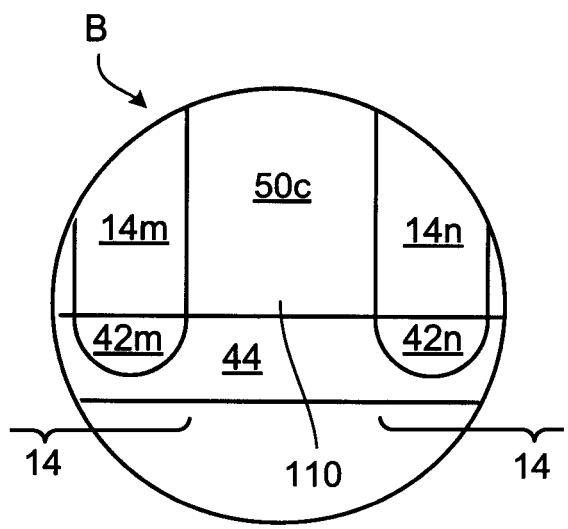

Referring to FIG. 12B, a bottom area of the capsules 14m, 14n are sealed by the bottom caps 42m, 42n. The wall 110 separating capsules 14m, 14n from different sections 14 can have a relatively large thickness, for example, about 20 to about 50 microns.

The DGS system 22 (FIG. 2) has a small size and is lightweight. The hydrogen gas stored in the DGS device 10 of the DGS system 22 has a high energy density, for example, a high gravimetric energy density. The DGS system 22 or DGS device 10 may be suitable for use in lightweight, portable applications, e.g., micro autonomous sensors and robots, such as small flying robots, and portable electronics, such as cell phones.

In addition to the control substrate 20 producing power, the control substrate 20 eliminates or reduces the amount of onboard electronics generally associated with power and power management for the above mentioned application. The control substrate 20 accomplishes this by integrating the circuits and software needed to control the control electronics 16 on each substrate 12. The power functions can not only be monitored and controlled but also adjusted dynamically to real time situations and events.

In addition to providing a substantial amount of stored energy on a micro level, the DGS device/system can also be used to perform other functions. For example, the DGS device/system may be used to store an antidote. When needed, e.g., during a combat situation, terrorist attack, health crisis or when a bio threat is detected, the DGS device/system can be activated and the antidote can be released from the capsules. The pressure in the capsules may be used to inject the antidote directly into a subject or release the antidote as an aerosol. Generally, the DGS device/system can be used to release a combination of materials as an injection or aerosol.

The DGS device/system can have other uses. In one example, the DGS device/system can propel items such as a dart. In another example, the DGS device/system may be used in connection with a reconnaissance device, such as a small flying robot, to target and deploy a directed projectile device, such as a dart. The projectile may be chemically treated for various desired effects. The projectile may include one or more sensors so that the propulsion mechanism of the DGS device/system could also be used to deploy sensors.

In another application, the DGS device 10 may store different gases in different sections or capsules. For example, $H_2$ and $O_2$ can be stored in separate capsules for use in circumstances where no or low quality air exists or under water. If an external gas consuming device coupled to the DGS device/system is expected to encounter poisonous or contaminated air during its operation, the gas consuming device may be configured to carry reactants. The oxygen provided by the DGS device/system would allow the gas consuming device to function both on land and under water and in space. In some applications, the DGS device/system may provide buoyancy control to small underwater autonomous vehicles.

Alternatively, the DGS device 10 may store vacuum. In this application, the gas is removed from the capsules and the capsules are then sealed to create instances of vacuum. When one capsule or a section of capsules are activated, external gases or liquids can flow into the capsules to quench the vacuum. The selection of sections of vacuum based on the addresses of the sections are similar to a digitally controlled vacuum. The precise control of which section of vacuum to be activated can be used to invoke a gas or a liquid to flow through an external flow circuit connected to the DGS device.

The thermal activation element 38 can have other configurations. Other than the thermal activation elements 38, other activation elements, e.g., magnetic activation elements, can be used together with or in replacement of the thermal activation elements 38. The capsules can have different shapes, for example, an oval, square, or triangular cross section. One or more parts of the capsules can be formed in the same silicon member. For example, the bottom caps and the bodies of the capsules can be formed in the same silicon member.

The control circuitry can be implemented in digital electronic circuitry, or in computer software, firmware, or hardware, such as logic circuitry, including counters, state-machines, special purpose logic circuitry, e.g., an FPGA (field programmable gate array) or an ASIC (application specific integrated circuit).

A number of embodiments of the invention have been described. Nevertheless, it will be understood that various modifications may be made without departing from the spirit and scope of the invention.

For example, other materials could be substituted or used in addition to the ones described for the DGS device and any of its components. Other dimensions and configurations, including the number of capsules per section, the number of section per DGS substrate, and the arrangement of sections, the sizes of the capsules, in addition the ones already described previously could be used. The DGS device may be used for any gas, including but not limited to: hydrogen, oxygen, and a mixture of gases, such as air.

The DGS device may also store vacuum as described above.

Other fabrication processes may be used in place or in additional to the processes described above. Other embodiments are within the scope of the following claims.

What is claimed is:

1. A gas storage system comprising:
a group of capsules formed within a silicon structure that comprises a single crystalline silicon substrate and a single crystalline silicon lid bonded to the single crystalline silicon substrate, and containing gas stored in the capsules at a relatively high pressure compared to atmospheric pressure; and
an activation element coupled to the group, the activation element configured to deliver energy in an amount sufficient to cause at least one of the capsules to release stored gas.

2. The gas storage system of claim 1 further comprising:
control electronics coupled to the activation element, the control electronics configured to deliver an electrical signal to control operation of the activation element.

3. The gas storage system of claim 1 wherein the capsules are interconnected by channels that allow gas to flow between the capsules, the capsules configured to release the gas simultaneously when at least one of the capsules is activated by the activation element.

4. The gas storage system of claim 1, wherein the capsules are discrete elements positioned adjacent to each other, the capsules having a wall thickness selected to be sufficient to withstand a predetermined storage pressure differential of gas in capsules sharing common walls, with a rupture of one of the capsules in the group, causing a cascading rupture of at least some of remaining capsules of the group.

5. The gas storage system of claim 1 wherein the capsules are filled with hydrogen gas that is at a pressure of at least 2200 psi.

6. The gas storage system of claim 1, wherein the group of capsules are arranged in a hexagonal packing.

7. The gas storage system of claim 1, wherein the group of capsules is a first group, the system further comprising:
plural groups including the first group of capsules formed within respective silicon structures that comprise single crystalline silicon substrates and single crystalline silicon lids bonded to respective single crystalline silicon substrates, and corresponding activation elements for the groups of the capsules, the activation elements configured to deliver energy in an amount sufficient to cause at least one of the capsules in each group to release stored gas; and
control electronics coupled to the activation elements.

8. The gas storage system of claim 1, wherein the group of capsules is part of a matrix of multiple groups of capsules formed within the substrate, wherein the group of capsules is addressable for activation.

9. A method for constructing a system that stores gas, the method comprising:
introducing an amount of liquefied gas into an assembly chamber that has placed therein a single crystalline silicon substrate having a plurality of micro-capsules within the substrate and a single crystalline silicon lid with the chamber configured to contain the gas under pressure, with the amount of liquefied gas selected to provide a predetermined pressure within the capsules after the liquefied gas transitions to a gaseous state; and
bonding the single crystalline silicon lid substrate to the single crystalline silicon substrate having the micro-capsules to seal the gas inside the capsules.

10. The method of claim 9, further comprising purging the assembly chamber with an inert gas; and
evacuating the inert gas from the chamber.

11. The method of claim 9, wherein the predetermined pressure is between 1,000 and 100,000 psi.

12. The method of claim 9 wherein bonding of the lid substrate to the substrate having the plurality of micro-capsules comprises anodic bonding.

13. A system for digitally controlled release of a fluid, the system comprises:
a substrate of a single crystalline material, the substrate having groups of fluid-filled capsules and a single crystalline lid bonded to the substrate, with the groups of fluid-filled capsules coupled to activation elements; and
control circuitry configured to deliver a control signal to a selected activation element, the control signal causing the selected activation element to rupture a corresponding group of fluid-filled capsules to release fluid in the corresponding group.

14. The system of claim 13 wherein the fluid is a gas contained at a relatively high pressure of at least 2200 psi.

15. The system of claim 13 wherein the fluid is a gas contained at a relatively high pressure in a range of 2200 psi to 17,500 psi.

16. The system of claim 13 wherein the capsules are arranged in groups each group configured to allow fluid to flow between the capsules within that group, such that the capsules within a group release the fluid simultaneously when at least one of the lids of a capsule in that group is ruptured by the activation element.

17. The system of claim 13 wherein the capsules are discrete elements packed adjacent to each other, the capsules having a wall thickness selected to be sufficient to withstand a predetermined storage pressure differential of gas in the capsules sharing common walls, with a rupture of one of the capsules in the group causing a cascading rupture of at least some of remaining capsules of the group.

18. The system of claim 13 wherein the capsules are filled with hydrogen gas that is at a pressure of at least 2200 psi.

19. The system of claim 13 wherein the group of capsules are arranged in a hexagonal packing.

20. The system of claim 13 further comprising:
plural substrates of a single crystalline material, with each substrate having the group of fluid-filled capsules, of a single crystalline material lids and corresponding activation elements for the group of capsules, the activation element configured to deliver energy in an amount sufficient to cause at least one of the capsules to release stored gas; and
control electronics coupled to the activation elements.

21. The system of claim 13 wherein the group of capsules is part of a matrix of multiple groups of capsules formed within the substrate, wherein the group of capsules is addressable for activation.

22. A fuel cell system for delivering power to one or more electronic devices, the fuel cell system comprising:
a fuel cell element; and
a fuel source, the fuel source comprising:
a substrate of a single crystalline material, the substrate having groups of gas-filled, capsules and a single crystalline lid bonded to the substrate, with the groups of fluid-filled capsules coupled to activation elements; and
control circuitry configured to deliver a control signal to a selected activation element, the control signal causing the selected activation element to rupture a corresponding group of gas-filled capsules to send gas in the corresponding group to the fuel cell element.

23. The fuel cell system of claim 22 wherein the capsules of the group are interconnected by channels configured to allow gas to flow between the capsules, and configured to release the gas simultaneously when at least one of the capsules is activated by the activation element.

24. The fuel cell system of claim 22 wherein the capsules of the group are discrete elements positioned adjacent to each other, the capsules having a wall thickness selected to be sufficient to withstand a predetermined storage pressure differential of gas in capsules sharing common walls, with a rupture of one of the capsules in the group, causing a cascading rupture of remaining capsules of the group.

25. The fuel cell system of claim 22 wherein the substrate is a first substrate, the fuel cell system further comprising:
 a second substrate of a single crystalline material, the substrate having gas-filled capsules and a single crystalline lid bonded to the substrate, with the groups of fluid-filled capsules arranged in groups coupled to activation elements; and
 control circuitry for activating the activation elements corresponding to the groups of the second substrate.

26. The fuel cell system of claim 22, further comprising:
 logic circuitry coupled to the first substrate, the logic circuitry configured to send an address of the selected activation element to the control circuitry.

27. A gas storage system comprises:
 a substrate of a single crystalline material having groups of gas-filled substantially cylindrical capsules, partially through the substrate, with a first major surface of the substrate providing a first terminus to the capsules;
 a single crystalline lid bonded to the second major surface of the substrate to cover top portions of the gas-filled substantially cylindrical capsules; and
 a transition layer of the material between the substrate and lid;
 at least one activation conductor element disposed over the lid in alignment with at least one of the cylindrical capsules; and
 control circuitry to deliver a current to the at least one activation element to cause a release of gas from at least one of the capsules.

28. The system of claim 27 wherein the capsules are filled with oxygen gas at a pressure of at least 2200 psi and less than a pressure at which the capsules would fail to store the gas without activating the activation conductor element.

29. The system of claim 27 wherein the capsules are filled with hydrogen gas at a pressure of at least 2200 psi and less than a pressure at which the capsules would fail to store the gas without activating the activation conductor element.

30. The system of claim 27 comprising:
 plural activation elements disposed over the lid in alignment with plural corresponding ones of the cylindrical capsules, with the control circuitry configured to deliver a control signal to a selected one of the plural activation elements causing rupture of the corresponding cylindrical capsule.

31. The system of claim 27 wherein gas is contained in the cylindrical capsules at a pressure in a range of 2200 psi to 17,500 psi.

32. The system of claim 27 wherein the capsules are arranged in groups, each group configured to allow fluid to flow between the capsules within that group, such that the capsules within that group release gas when at least one of the lids of a capsule in that group is ruptured by the activation element.

33. The system of claim 27 wherein the capsules are discrete elements packed adjacent to each other, the capsules having a wall thickness selected to be sufficient of a sufficient strength to withstand a predetermined storage pressure differential of gas in capsules sharing common walls, with a rupture of one of the capsules in the group, causing a cascading rupture of remaining capsules of the group.

34. The system of claim 27 wherein the group of capsules are arranged in a hexagonal packing.

35. The system of claim 27 further comprising:
 plural substrates of the single crystalline material, with each substrate having the groups of gas fluid-filled cylindrical capsules of a single crystalline material and lids and corresponding activation elements for the groups of capsules and control electronics coupled to the activation elements with the plural substrates stacked together.

* * * * *